US011018384B2

(12) United States Patent
van Lammeren

(10) Patent No.: US 11,018,384 B2
(45) Date of Patent: May 25, 2021

(54) DUAL-CELL SUPERVISOR CIRCUIT FOR HIGH-VOLTAGE AUTOMOTIVE BATTERY PACKS

(71) Applicant: NXP B.V., Eindhoven (NL)

(72) Inventor: Johannes P. M. van Lammeren, Beuningen (NL)

(73) Assignee: NXP B.V., Eindhoven (NL)

( * ) Notice: Subject to any disclaimer, the term of this patent is extended or adjusted under 35 U.S.C. 154(b) by 256 days.

(21) Appl. No.: 16/047,140

(22) Filed: Jul. 27, 2018

(65) Prior Publication Data
US 2020/0036058 A1   Jan. 30, 2020

(51) Int. Cl.
G01R 31/36 (2020.01)
H01M 10/48 (2006.01)
G01R 31/389 (2019.01)
G01R 31/396 (2019.01)

(52) U.S. Cl.
CPC ........ *H01M 10/482* (2013.01); *G01R 31/389* (2019.01); *G01R 31/396* (2019.01); *H01M 10/486* (2013.01); *H01M 2220/20* (2013.01)

(58) Field of Classification Search
None
See application file for complete search history.

(56) References Cited

U.S. PATENT DOCUMENTS 8,680,868 B2   3/2014 van Lammeren et al.
9,893,385 B1*  2/2018 Nayar ................. H01M 10/425
2012/0306504 A1  12/2012 Van Lammeren
2012/0310562 A1  12/2012 van Lammeren et al.
2014/0301000 A1  10/2014 Takahashi et al.
2015/0019771 A1   1/2015 Greef et al.
2016/0169980 A1   6/2016 van Lammeren et al.
2016/0172720 A1   6/2016 Lammeren
2020/0028219 A1*  1/2020 Lee ..................... H01M 10/48

FOREIGN PATENT DOCUMENTS

CN   101362427 A   2/2009
EP   2530481 A2   12/2012
EP   2667166 A2   11/2013
EP   2667166 A3    9/2016

(Continued)

OTHER PUBLICATIONS

NXP Semiconductors, MC33771: 14-Channel Li-ion Battery Cell Controller IC, printed Jun. 23, 2018.

(Continued)

*Primary Examiner* — Haroon S. Sheikh

(57) ABSTRACT

A high-voltage automotive battery pack, system, architecture, and methodology include a first and second adjacent battery cells (410, 420) connected to a dual-cell supervisor circuit (412) that is positioned to bridge the first and second battery cells and that is connected to monitor the first and second battery cells, wherein the dual-cell supervisor circuit comprises current injection and impedance-detection circuitry (510) for separately measuring a voltage, impedance, and temperature at each of the first and second battery cells, alone or in combination with an external switched inductor (501) which is coupled to be switched across the first battery cell (505) or the second battery cell (506) to perform low-loss impedance measurement of the first and second battery cells.

19 Claims, 5 Drawing Sheets

(56) References Cited

FOREIGN PATENT DOCUMENTS

| EP | 3171551 | A1 | 5/2017 |
| EP | 2530481 | A3 | 7/2017 |
| GB | 2541413 | A  | 2/2017 |

OTHER PUBLICATIONS

NXP Semiconductors, MC33771B_SDS, Battery cell controller IC, Short data sheet: technical data, Rev. 5.0, May 2, 2018.
Linear Technology Corporation, LTC6811-1/LTC6811-2, Multicell Battery Monitors, 2016.
Datang NXP Semiconductors, Battery Management IC (DNB1168), 2014.
Matindoust, Samaneh, "On-line Battery Impedance Measurement Using Oscillation Excitation", 26th Iranian Conference on Electrical Engineering (ICEE2018), May 8, 2018, IEEE, op. 1729-1734.

\* cited by examiner

DUAL-CELL SUPERVISOR CIRCUIT FOR HIGH-VOLTAGE AUTOMOTIVE BATTERY PACKS

BACKGROUND OF THE INVENTION

Field of the Invention

The present invention is directed in general to monitoring battery cells. In one aspect, the present invention relates to a cell supervisory circuits, methods, and systems for use with monitoring battery cells to detect cell voltages, impedance, current, temperatures, and the like.

Description of the Related Art

Battery management systems (BMS) for high-voltage battery pack applications, such as such automotive applications (e.g., hybrid electric and electric vehicles) and industrial applications (e.g., energy storage systems and uninterruptible power supply systems) are built around ICs called cell supervisor circuits (CSCs). Existing battery management systems have multi-cell supervisor circuits (MCSC), where each MCSC integrated circuit is connected to monitor six or more battery cells (e.g., the MC33771B_SDS manages 7-14 cells). And while single cell supervisor circuits (SCSC) are being developed to so that each SCSC integrated circuit is connected to monitor a single battery cell, such SCSC solutions typically must be mounted close to the cell it monitors. As will be appreciated, there are tradeoffs between MCSC and SCSC approaches in terms of impedance measurement complexity (e.g., MCMS IC's require many long wires between the MCMS IC and its cells in order to measuring impedance), the need for external components (e.g., MSCS ICs require external temperature sensor components and associated connection wiring, while SCSC ICs do not since they are mounted close to the supervised cell), and the overall IC costs (e.g., fewer MSCS ICs are required than the SCSC approach for a given battery system which may require 100 IC's in a typical automotive application). As seen from the foregoing, existing cell supervisor circuits are extremely difficult at a practical level by virtue of the challenges with accurately and efficiently monitoring the cell voltages, temperatures, impedance and other performance parameters for multi-cell battery systems.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
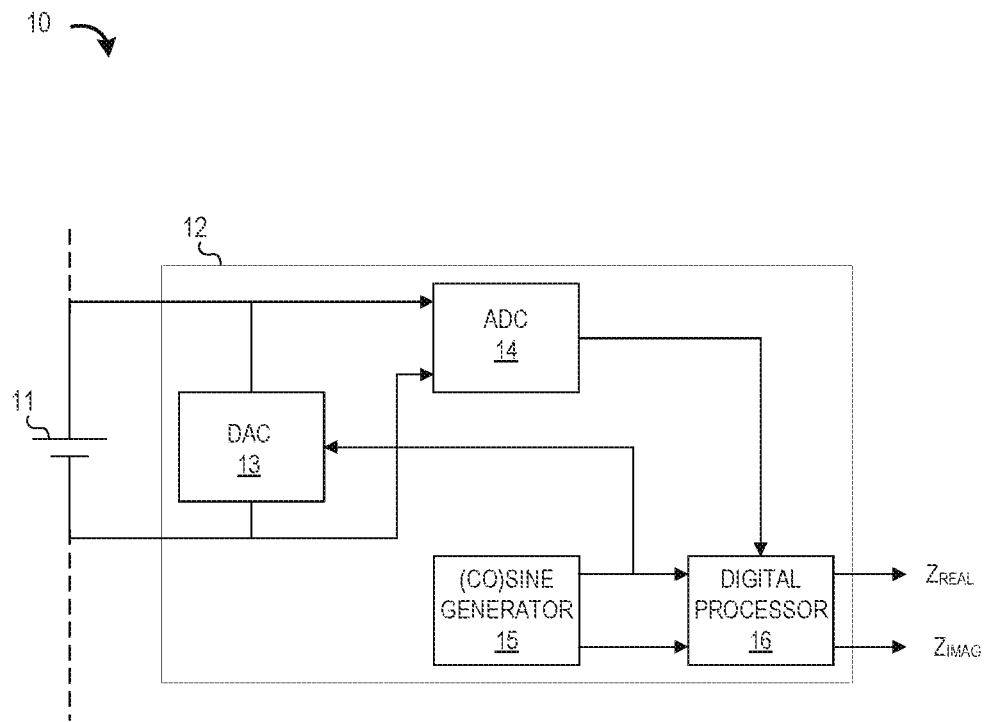
FIG. 1 depicts a simplified block diagram of an integrated impedance measurement circuit.

A high-voltage automotive battery management system, architecture, and methodology are described for using dual-cell supervisor integrated circuits to simultaneously monitor adjacent pairs of battery cells for differential cell voltages, impedance and battery temperature measurements, thereby providing numerous advantages over battery management systems based on single-cell or multi-cell supervisors. In selected embodiments, each dual-cell supervisor integrated circuit is positioned and connected between adjacent battery cells to combine the advantages of single-cell supervisors (e.g., short local wiring, multiple temperature measurement points, impedance measurement, easy assembly) with those of multi-cell supervisors (e.g., fewer ICs, higher supply voltage) while also performing impedance measurements on adjacent cells with constant die temperature (e.g., no external components needed) and/or with minimal energy loss (e.g., with minimal external components), For example, by mounting dual-cell supervisor circuits (DCSC) between positive and negative terminals of adjacent cells, each DCSC can perform cell-impedance measurements with short, local wiring connections without requiring external components while dissipating power, or can measure the cell-impedance with very little power consumption by using a few external components. In other embodiments, each DCSC may be mounted on the bus bar that connects adjacent cells so that the size of the flexfoils can be reduced to reduce overall system cost. When connected to monitor two adjacent battery cells, each DCSC may include complementary pairs of current injection circuits and impedance-detection circuitry coupled to receive a combined supply voltage provided by both battery cells, doubling the supply voltage that would be provided to a single cell supervisor circuit. This is an advantage compared to a SCSC, as the voltage of a nearly empty, heavily loaded battery cell can be below the SCSC's operating voltage. In addition, each DCSC may include a pair of digital-to-analog converter (DAC) circuits which are coupled to drive the battery cells with opposite-phase currents during impedance measurement so that the sum of the currents of two DACs in the IC can be kept constant at all times for all measurement frequencies to maintain constant temperature at the dual-cell supervisor circuit, thereby reducing or eliminating measurement errors induced by temperature variations. Alternatively, each DCSC may be connected to an external switched inductor element which is coupled to the common node of the adjacent battery cells, thereby providing nearly lossless impedance measurement for use in temperature monitoring. With the disclosed DCSC embodiments, it will be appreciated that there are numerous advantages over single-cell supervisors, including larger supply voltage operating parameters, reduced temperature variation during impedance measurement, reduced numbers of ICs and communication lines, and easier assembly for meeting strict PCB footprint limitations.

While the present disclosure may use dual-cell supervisor circuits in a wide variety of battery system applications, for the sake of brevity, the present description refers to selected dual-cell supervisor circuits embodiments without describing in detail conventional techniques related to current injection stages and/or impedance-detection stages which use low drop out (LDO) regulators, analog-to-digital (ADC) architectures, digital-to-analog converter (DAC) architectures, voltage comparison circuits, digital logic circuits, and other functional aspect of such system and the individual system operating components thereof. Furthermore, the connecting lines shown in the various figures contained herein are intended to represent example functional relationships and/or physical couplings between the various elements. It should be noted that many alternative or additional functional relationships or physical connections may be present in a practical embodiment. In addition, for ease of discussion, the figures illustrate example dual-cell supervisor implementations, but those skilled in the art can adapt the illustrated techniques for use with other dual-cell supervisor implementations using the provided guidelines without departing from the scope of the present disclosure.

To provide additional details for an improved understanding of the limitations of conventional cell supervisor circuit designs, reference is now made to FIG. 1 which is a simplified block diagram 10 illustrating an integrated impedance measurement circuit 12 which is connected to measure the impedance of a battery cell 11. As illustrated, the integrated impedance measurement circuit 12 includes a DAC 13 which is connected to inject a current (e.g., a sinusoidal current, square wave current, etc.) into the battery cell 11 in response to a sinusoidal input control signal generated by the sine/cosine generator 15. In addition, the integrated impedance measurement circuit 12 includes an ADC 14 which is connected to measure the voltage variation of the battery cell 11 that are generated in response to the injected current by converting the resulting analog voltage ripple developed across the battery cell 11 to a digital value for processing by the processor 16 which is connected to the outputs from the sine/cosine generator 15 and the digital output from the ADC 14 to compute the impedance of the cell 11. In selected embodiments, the digital processor 16 receives voltage data from the ADC 14, separates low-frequency components of the voltage data from high-bandwidth (e.g., including high frequencies) components of the voltage data, and extracts impedance information for the battery cell 11 from the high-bandwidth components. Unfortunately, cell supervisor circuits which measure the impedance by injecting a current into the cell with an integrated current source typically have a temperature variation problem that arises from the fact that the current from the DAC 13 will cause dissipation in the integrated impedance measurement circuit 12. For example, with a 4V cell voltage and 100 mA current, the resulting power dissipation of 400 mW will lead to a significant heating up of the integrated impedance measurement circuit 12.

Figure 2:
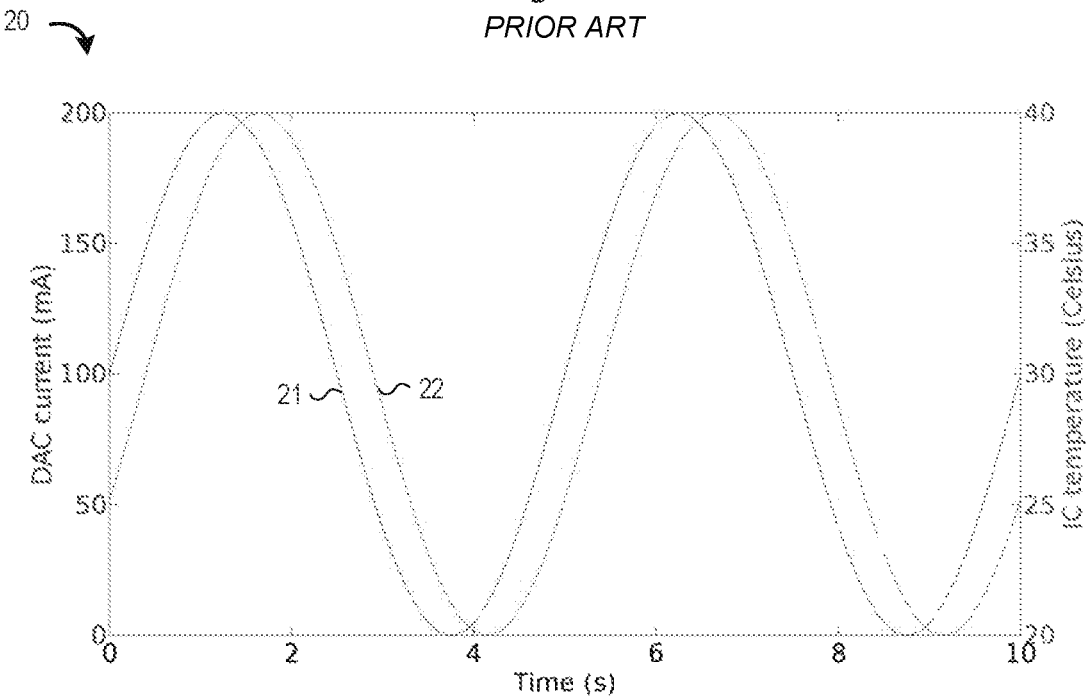
FIG. 2 depicts simulated waveforms for an example DAC current and IC temperature measured by a single-cell supervisor circuit which injects a sinusoidal DAC current into the cell for purposes of measuring the cell temperature.

When the injected current frequency is low (e.g., below 100 Hz), the dissipation will cause the temperature of the integrated impedance measurement circuit 12 to synchronously vary in a time-delayed fashion with the measurement frequency. This can lead to large measurement errors if the IC circuits, like the voltage reference, are not perfectly temperature independent. To illustrate this problem, reference is now made to FIG. 2 which depicts simulated waveforms 20 for an example DAC current and IC temperature measured by a single-cell supervisor circuit. As illustrated, the sinusoidal DAC current 21 is injected into the cell for purposes of measuring the cell temperature. At this current frequency, the measured IC temperature waveform 22 also varies as a synchronous sinusoidal signal. The amplitude and phase of the temperature variation will introduce errors in the measurement of the magnitude and phase of the impedance.

Figure 3:
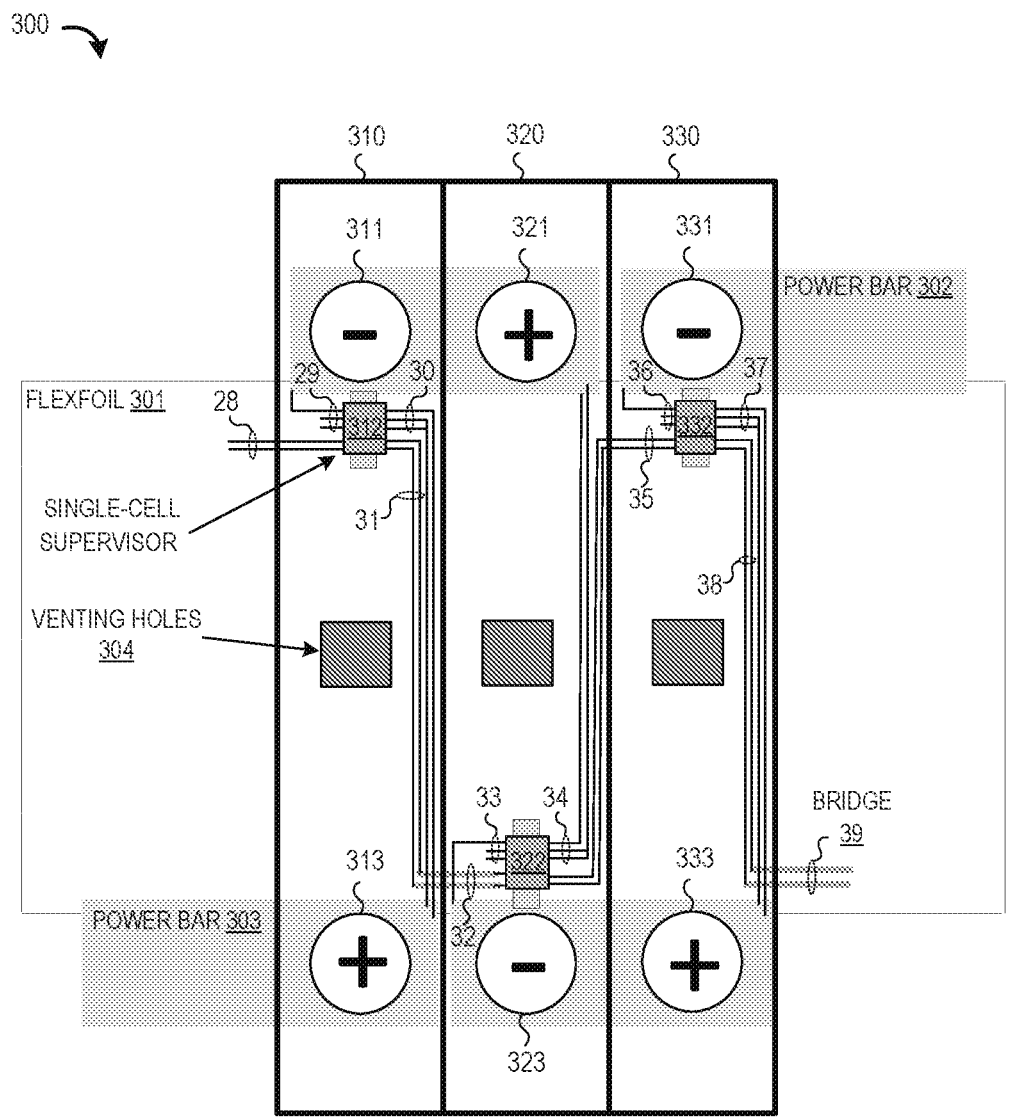
FIG. 3 diagrammatically depicts the board layout of a battery management system which uses single-cell supervisor circuits at each battery cell to monitor cell performance.

To provide additional details for an improved understanding of the limitations of conventional cell supervisor circuit designs, reference is now made to FIG. 3 which is a simplified block diagram 300 which diagrammatically depicts a board layout for a battery management system which uses single-cell supervisor (SCS) circuits 312, 322, 332 at each battery cell 310, 320, 330 to separately monitor the performance of the battery cells. As illustrated, cell supervisor circuit 312, 322, 332 is mounted as close as possible to the negative terminal of its corresponding cell. This guarantees the best possible thermal coupling, so the internal temperature can be measured as accurately as possible. For example, a first SCS circuit 312 is positioned for close connection to the negative terminal 311 of the battery cell 310, with one or more short conductors 29 connected to the negative terminal 311 and one or more long conductors 31 connected to the positive terminal 313. Similarly, a second SCS circuit 322 is positioned for close connection to the negative terminal 323 of the battery cell 320, with one or more short conductors 33 connected to the negative terminal 323 and one or more long conductors 34 connected to the positive terminal 321, while a third SCS circuit 332 is positioned for close connection to the negative terminal 331 of the battery cell 330, with one or more short conductors 36 connected to the negative terminal 331 and one or more long conductors 37 connected to the positive terminal 333. Connected in a daisy-chain configuration, the single cell supervisor circuits 312, 322, 332 use communication conductors 28, 31, 32, 35, 38, 39 to convey input/output communication signals. As illustrated, it can be seen that there are many long communication conductor wires between different cell supervisor circuits which must be routed on the flexfoil 301 to avoid power bars 302, 303, venting holes 304, and other layout constraints (not shown). In addition, the communication conductors include bridge conductors 32, 39 which are formed as bond wires to route signals over/under other conductor lines formed in the flexfoil, adding fabrication costs to the system. And while the close proximity of the single-cell supervisor circuits 312, 322, 332 to the terminals 311, 323, 331 allows them to accurately measure the temperature, they typically require external components to measure the cell impedance.

Figure 4:
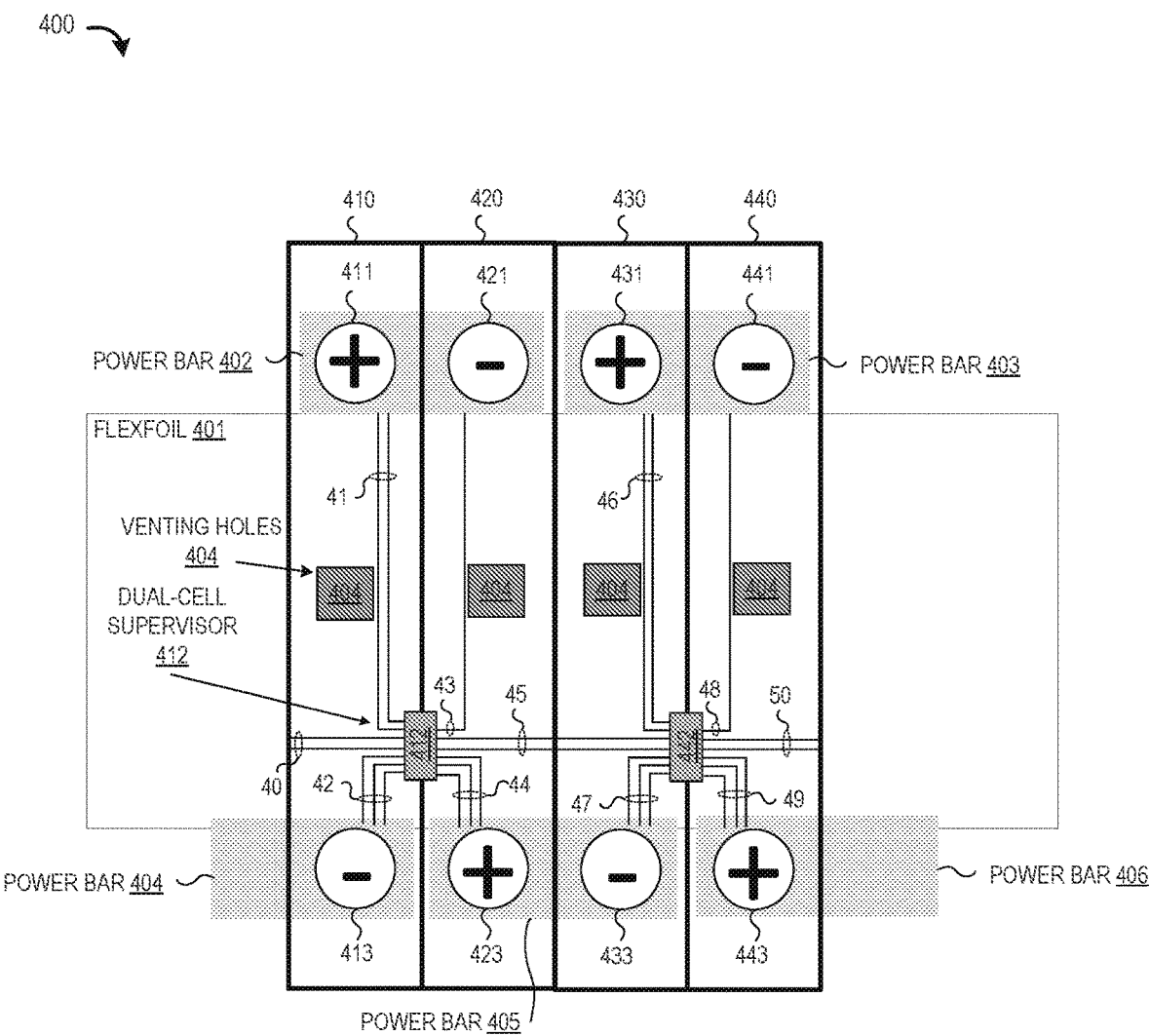
FIG. 4 diagrammatically depicts a first board layout of a battery management system which uses dual-cell supervisor circuits mounted between positive and negative terminals of adjacent cells in accordance with selected embodiments of the present disclosure.

To provide additional details for an improved understanding of selected embodiments of the present disclosure, reference is now made to FIG. 4 which is a simplified block diagram which diagrammatically depicts a first board layout 400 of a battery management system which uses dual-cell supervisor (I)SC) circuits 412, 442, each (e.g., 412) mounted between positive and negative terminals (e.g., 413, 423) to monitor adjacent battery cells (e.g., 410, 420) in accordance with selected embodiments of the present disclosure. As illustrated, adjacent terminals are connected across shared power bar conductors 402-406 to form a sequence of battery cells with the terminals 411, 421 of the battery cells 410, 420 connected at a first power bar 402, with the terminals 423, 433 of the battery cells 420, 430 connected at a second power bar 405, with the terminals 431, 441 of the battery cells 430, 440 connected at a third power bar 403, and so on. In this configuration of battery cells, each dual-cell supervisor circuit (e.g., 412) may be placed to bridge adjacent battery cells (e.g., 410, 420) so as to be located or positioned between the negative terminal of one cell and the positive terminal of the next cell. Thus positioned, the dual-cell supervisor circuits 412, 442 need not necessarily be mounted as close as possible to the negative terminals since the impedance measurement can be performed with constant die temperature (no external components needed) or with minimal energy loss (with a few external components), as described more fully hereinbelow. For example, a first DCS circuit 412 is positioned to bridge the first and second battery cells 410, 420, Thus positioned, the first DCS circuit 412 is connected over one or more (short) conductors 42 to the negative terminal 413 of the first battery cell 410, and is connected over one or more (long) conductors 41 to the positive terminal 411 of the first battery cell 410. In addition, the first DCS circuit 412 is connected over one or more (short) conductors 44 to the positive terminal 423 of the second battery cell 420, and is connected over one or more (long) conductors 43 to the negative terminal 411 of the second battery cell 40. Similarly, a second DCS circuit 442 is positioned to bridge the third and fourth battery cells 430, 440, with a first set of (short) conductor(s) 47 to the negative terminal 433 of the third battery cell 430, a second set of (long) conductors 46 to the positive terminal 431 of the third battery cell 430, a third set of (long) conductor(s) 48 to the negative terminal 441 of the fourth battery cell 440, and a fourth set of (short) conductors 49 to the positive terminal 443 of the fourth battery cell 440. Connected in a daisy-chain configuration, the dual cell supervisor circuits 412, 422 use communication conductors 40, 45, 50 to convey input/output communication signals without requiring bond wire/bridge conductors to route signals over/under other conductor lines formed in the flexfoil 401.

As illustrated, it can be seen that the positioning of the DSC circuits 412, 442 to bridge adjacent battery cells in the first board layout 400 relaxes the layout constraints on the flexfoil 401 and also reduces the number of integrated circuits, thereby providing advantages over the use single-cell supervisor circuits. The positioning of the DSC circuits 412, 442 to bridge adjacent battery cells also provides a mechanism for addressing die temperature variation during impedance measurement that can arise with single-cell supervisor circuits. On the other hand, the use of DSC circuits 412, 442 retains one or more advantages of using single-cell supervisor circuits as compared to multi-cell supervisor circuits. For example, the use of DSC circuits 412, 442 provides the ability to measure the temperature of many more cells than multi-cell supervisor circuits. In addition, the DSC circuits 412, 442 provide the ability to measure each cell's impedance with greater accuracy than multi-cell supervisor circuits. Finally, the use of DSC circuits 412, 442 allows shorter local wiring to be used than is possible with multi-cell supervisor circuits.

Figure 5:
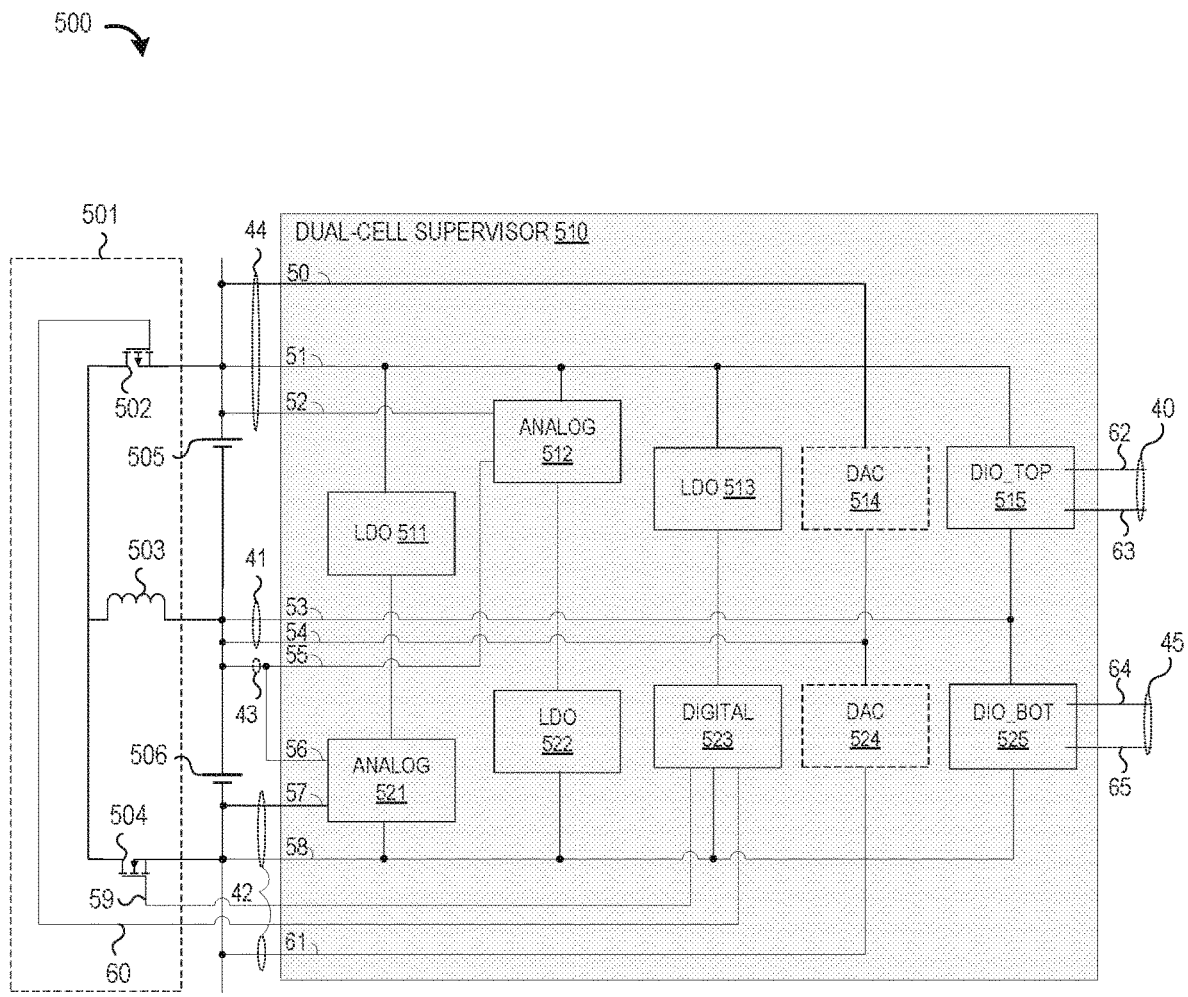
FIG. 5 depicts a simplified block diagram of dual-cell supervisor integrated circuit which is connected to monitor two battery cells in accordance with selected embodiments of the present disclosure.

To provide additional details for an improved understanding of selected embodiments of the present disclosure, reference is now made to FIG. 5 which is a simplified block diagram 500 of dual-cell supervisor integrated circuit 510 which is connected to monitor each of two battery cells 505, 506 for a plurality of supervisor functions, including cell voltage, cell impedance, and cell balancing. To this end, the disclosed dual-cell supervisor integrated circuit 510 includes complementary pairs of current injection and impedance-detection circuit blocks 511/521, 512/522 coupled to receive a combined supply voltage generate across both battery cells 505, 506 which are connected in series, there doubling the supply voltage that would be provided to a single cell supervisor circuit.

In selected embodiments, a first current injection and impedance-detection circuit includes a low drop-out (LDO) voltage regulator circuit block 511 and analog measurement circuit block 521 that are series-connected in parallel with the battery cells 505, 506 with the analog measurement circuit block 521 connected to measure the voltage and impedance of the second battery cell 506 using any suitable measurement circuitry. For example, the analog measurement circuit block 521 may include one or more analog-to-digital converters (ADC) for measuring the voltage of the second battery cell 506, suitable low pass or anti-aliasing filters which are used to generate filtered output signals, a (co)sine generator and digital-to-analog converter (DAC) for driving the battery cell, and a digital processor connected and configured to detect the amplitude and phase of the measurement frequency/frequencies of the measured voltage and/or impedance values (e.g., Zreal, Zimag) at the second battery cell 506. As depicted, the LDO voltage regulator circuit block 511 is connected at one input/output 51 (corresponding to one of the conductors 44 in FIG. 4) to the positive terminal of the first battery cell 505, and is also series-connected to the analog measurement circuit block 521. In turn, the analog measurement circuit block 521 is connected via inputs 56, 57 (corresponding to one of the conductors 41, 42 in FIG. 4) to measure the voltage of the second battery cell 506, and is also connected at one input/output 57 (corresponding to one of the conductors 42 in FIG. 4) to the negative terminal of the second battery cell 506.

In addition, a second current injection and impedance-detection circuit includes an analog measurement circuit block 512 and a low drop-out (LDO) voltage regulator circuit block 522 that are series-connected in parallel with the battery cells 505, 506 with the analog measurement circuit block 512 connected to measure the voltage and impedance of the first battery cell 505 using any suitable measurement circuitry. For example, the analog measurement circuit block 512 may include one or more ADCs, suitable low pass or anti-aliasing filters, a (co)sine generator and DAC, and a digital processor connected and configured to detect the amplitude and phase of the measurement frequency/frequencies of the measured voltage and/or impedance values (e.g., Zreal, Zimag) at the first battery cell 505. In addition, the depicted analog measurement circuit block 512 is connected at one input/output 51 (corresponding to one of the conductors 44 in FIG. 4) to the positive terminal of the first battery cell 505, and is also connected to the LDO voltage regulator circuit block 522 connected at one input/output 58 (corresponding to one of the conductors 42 in FIG. 4) to the negative terminal of the second battery cell 506. Finally, the analog measurement circuit block 512 is connected via inputs 52, 55 (corresponding to one of the conductors 44, 43 in FIG. 4) to measure the voltage of the first battery cell 505.

In selected embodiments, the dual-cell supervisor integrated circuit 510 also includes a low drop-out (LDO) voltage regulator circuit block 513 and digital circuit block 523 that are series-connected in parallel with the battery cells 505, 506. This series connection (and also that of 511, 521 and 512, 522) maintains balance between the first and second battery cells 505, 506. For example, the digital circuit block 523 may include filter, control, and communication circuits. As depicted, the MO voltage regulator circuit block 513 is connected at one input/output 51 (corresponding to one of the conductors 44 in FIG. 4) to the positive terminal of the first battery cell 505, and is also series-connected to the digital measurement circuit block 523 which is connected by at least one input/output 58 (corresponding to one of the conductors 42 in FIG. 4) to the negative terminal of the second battery cell 506.

The dual-cell supervisor integrated circuit 510 may also include a pair of data input/out (DIO) communication circuit blocks 515, 525 which are series-connected in parallel with the battery cells 505, 506 to communicate with other DCS circuits in the battery management system. For example, a first upper DIO circuit block (DIO TOP) 515 is connected at a first input/output 51 (corresponding to one of the conductors 44 in FIG. 4) to the positive terminal of the first battery cell 505, and is also connected at a second input/output 53 (corresponding to one of the conductors 41 in FIG. 4) to a shared node between the first and second battery cells 505, 506 (corresponding to the power bar 402 in FIG. 4). In addition, a second lower IMO circuit block (DIO BOT) 525 is connected at a first input/output 53 (corresponding to one of the conductors 41 in FIG. 4) to a shared node between the first and second battery cells 505, 506 (corresponding to the power bar 402 in FIG. 4), and is also connected at a second input/output 58 (corresponding to one of the conductors 42 in FIG. 4) to the negative terminal of the second battery cell 506. IMO circuit blocks 515 and 525 are mostly identical circuits, so as not to cause unbalance between the battery cells.

In selected embodiments, each dual-cell supervisor integrated circuit 510 may include a pair of digital-to-analog converter (DAC) circuit blocks 514, 524 which are series-connected in parallel with the battery cells 505, 506 to perform passive impedance measurement using opposite-phase DACs 514, 524 without external components. As indicated with dashed lines, the digital-to-analog converter (DAC) circuit blocks 514, 524 are optionally included in a first impedance measurement embodiment. For example, a first depicted DAC 514 is connected at a first input/output 50 (corresponding to one of the conductors 44 in FIG. 4) to the positive terminal of the first battery cell 505, and is also connected at a second input/output 54 (corresponding to one of the conductors 41 in FIG. 4) to a shared node between the first and second battery cells 505, 506 (corresponding to the power bar 402 in FIG. 4). In addition, the second depicted DAC 524 is connected at a first input/output 54 (corresponding to one of the conductors 41 in FIG. 4) to a shared node between the first and second battery cells 505, 506 (corresponding to the power bar 402 in FIG. 4), and is also connected at a second input/output 61 (corresponding to one of the conductors 42 in FIG. 4) to the negative terminal of the second battery cell 506. Thus connected, the DACs 514, 524 can drive the battery cells with opposite-phase currents when performing impedance measurement with the current injection and impedance-detection circuit blocks 511/521, 512/522 so that the sum of the currents of two DACs 514, 524 in the DSC IC 510 can be kept constant at all times for all measurement frequencies, thereby reducing temperature variation that can introduce errors in impedance measurement (from which the internal battery cell temperature can be deduced).

In other embodiments, each dual-cell supervisor integrated circuit 510 may include an external switched inductor circuit 501 which is connected in parallel with the battery cells 505, 506 to perform low-loss impedance measurement without requiring the opposite-phase DACs 514, 524. As indicated with dashed lines, the external switched inductor circuit 501 is optionally included in a second impedance measurement embodiment wherein an external switched inductor element 504 is selectively coupled across each of the adjacent battery cells 505, 506, thereby providing nearly lossless impedance measurement for use in temperature monitoring. For example, a first PMOSFET switch 502 (source-connected at a first DCS input/output 51 corresponding to one of the conductors 44 in FIG. 4) is gated by a first control signal 60 generated by the digital circuit block 523 to connect the positive terminal of the first battery cell 505 to a switching terminal of inductor element 503 which has its opposite terminal connected to a shared node between the first and second battery cells 505, 506. In addition, a second PMOSFET switch 504 (source-connected at a second DCS input/output 58 corresponding to one of the conductors 42 in FIG. 4) is gated by a second control signal 59 generated by the digital measurement circuit block 523 to connect the negative terminal of the second battery cell 506 to the switching terminal of inductor element 503 which has its opposite terminal connected to a shared node between the first and second battery cells 505, 506. While the PMOS switches 502, 503 could be integrated within the DCS IC 510, there are advantages to placing the switches 502, 503 outside the IC 510 since they carry high peak currents that can easily interfere with the sensitive other circuits in the DCS IC 510. However connected, the external switched inductor circuit 501 can be used to perform nearly lossless impedance measurement with the current injection and impedance-detection circuit blocks 511/521, 512/522, thereby reducing temperature variation induced errors in impedance measurement.

As disclosed hereinabove, voltage balancing and impedance measurement at each battery cell pair may be performed by the internal DACs 514, 524 and/or the external switched inductor 501. However, it will be appreciated that there can be other approaches. For example, the integrated circuit process may allow the switches 502, 504 to be included in the dual-cell supervisor integrated circuit 510. In addition or in the alternative, an external switch and resistor can be used in place of the internal DACs 514, 524.

Figure 6:
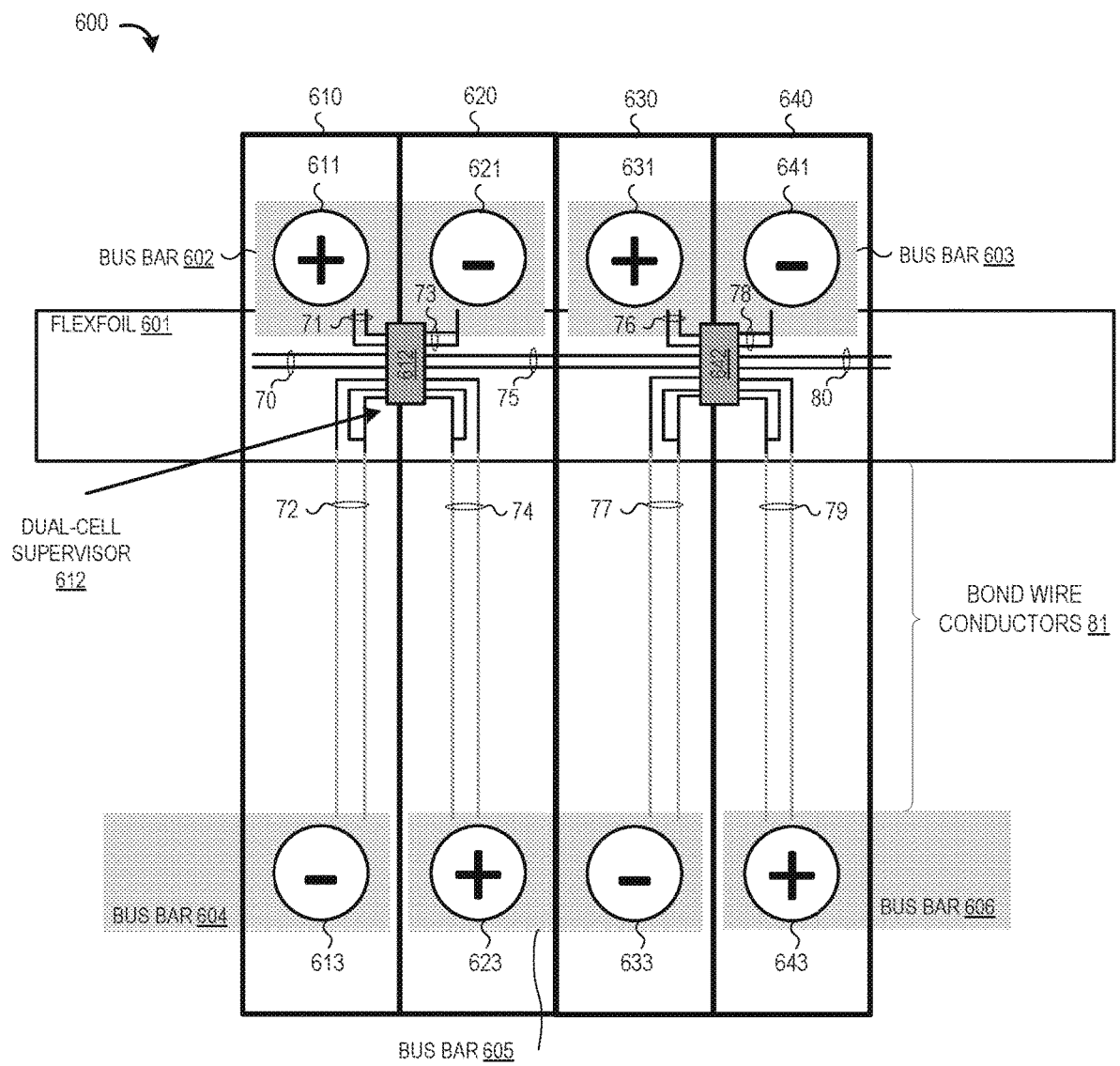
FIG. 6 diagrammatically depicts a second board layout of a battery management system which uses dual-cell supervisor circuits mounted on the bus bar that connects adjacent cells in accordance with selected embodiments of the present disclosure.

To provide additional details for an improved understanding of selected embodiments of the present disclosure, reference is now made to FIG. 6 which is a simplified block diagram which diagrammatically depicts a second board layout 600 of a battery management system which uses dual-cell supervisor (DSC) circuits 612, 641 which are each mounted on the bus bar (e.g., 602) that connects the shared terminal of adjacent battery cells (e.g., 610, 620) in accordance with selected embodiments of the present disclosure. As illustrated, adjacent terminals are connected across shared bus bar conductors 602-606 to form a sequence of battery cells with the terminals 611, 621 of the battery cells 610, 620 connected at a first bus bar 602, with the terminals 623, 633 of the battery cells 620, 630 connected at a second bus bar 605, with the terminals 631, 641 of the battery cells 630, 640 connected at a third bus bar 403, and so on. In this configuration of battery cells, each dual-cell supervisor circuit (e.g., 612) is connected and mounted to the bus bar (e.g., 602) which connects the shared positive/negative terminals of adjacent battery cells (e.g., 610, 620). For example, a first DCS circuit 612 is positioned on the bus bar 602 to monitor the first and second battery cells 610, 620. Thus positioned, the first DCS circuit 612 is connected over one or more (short) conductors 71 to the positive terminal 613 of the first battery cell 610, and is connected over one or more (long) conductors 72 to the negative terminal 612 of the first battery cell 610. In addition, the first DCS circuit 612 is connected over one or more (short) conductors 73 to the negative terminal 621 of the second battery cell 620, and is connected over one or more (long) conductors 74 to the positive terminal 623 of the second battery cell 620. Similarly, a second DCS circuit 642 is positioned on the bus bar 603 to monitor the third and fourth battery cells 630, 640, with a first set of (short) conductor(s) 76 to the positive terminal 631 of the third battery cell 630, a second set of (long) conductors 77 to the negative terminal 633 of the third battery cell 630, a third set of (long) conductor(s) 79 to the positive terminal 643 of the fourth battery cell 640, and a fourth set of (short) conductors 78 to the negative terminal 641 of the fourth battery cell 640. Connected in a daisy-chain configuration, the dual cell supervisor circuits 612, 622 use communication conductors 70, 75, 80 to convey input/output communication signals without requiring bond wire/bridge conductors to route signals over/under other conductor lines formed in the flexfoil 601.

As illustrated, it can be seen that the positioning of the DSC circuits 612, 642 on the bus bars 602, 603 in the second board layout 600 relaxes the layout constraints on the flexfoil 601 and also reduces the number of integrated circuits, thereby providing advantages over the use of single-cell supervisor circuits. The positioning of the DSC circuits 612, 642 on the bus bars 602, 603 also allows the size of the flexfoil 601 to be reduced, in which case bond wire conductors 81 may be used for any portion of the conductors 72, 74, 77, 79 which extend past the flexfoil 601, thereby reducing system and manufacturing costs.

As seen from the foregoing, the dual-cell supervisor integrated circuits (e.g., 412, 510, 612) provide a number of advantages over single-cell supervisor circuits, including doubling the supply voltage, reducing or eliminating temperature variation during impedance measurement, halving the number of ICs and communication lines needed in the system, and facilitating assembly as the PCB footprint of the dual-cell supervisor is less than two times the footprint of the single-cell supervisor. In addition, the dual-cell supervisor integrated circuit provides a number of advantages over multi-cell supervisor circuits, including increasing the number of temperature measurement points, providing cell impedance measurements at each cell, and reducing the amount and length of connection wiring. In addition, the dual-cell supervisor integrated circuit has an added advantage over single-cell supervisor of being able to perform impedance measurement with much less dissipation than two times the dissipation of a single-cell supervisor. And it can perform active balancing (even simultaneously with the impedance measurement) with the same components between the two cells that it is connected to. For example, the PMOSFET switches (e.g., 502, 504) can be used to move charge between the adjacent cells. In single-cell supervisor systems, it is much harder to make this circuit, as the timing of the switches is very critical so that two adjacent single-cell supervisor ICs have to be extremely well-synchronized. In the dual-cell supervisor circuit, this problem does not exist as the digital timing reference circuit (e.g., 523) that drives both switches is one and the same.

By now it should be appreciated that there has been provided a high-voltage automotive battery pack, system, architecture, and methodology. In the disclosed embodiments, the battery pack, system, architecture, and methodology includes at least a first battery cell and a second battery cell which may be positioned as adjacent battery cells in a multi-cell automotive battery pack. The battery pack, system, architecture, and methodology may also include a dual-cell supervisor circuit positioned to bridge the first and second battery cells and connected to monitor the first and second battery cells, wherein the dual-cell supervisor circuit comprises current injection and impedance-detection circuitry for separately measuring a voltage, impedance, and temperature at each of the first and second battery cells. In selected embodiments, the dual-cell supervisor circuit is embodied as an integrated circuit that does not require external components to measure the impedance of the first and second battery cells. In other embodiments, the dual-cell supervisor circuit is embodied as an integrated circuit that is mounted on a first power bar that couples a first electrode of the first battery cell to a second electrode of the second battery cell. In selected embodiments, the dual-cell supervisor circuit includes a first analog circuit coupled to measure a voltage at the first battery cell, and a second analog circuit coupled to measure a voltage at the second battery cell. In addition or in the alternative, the dual-cell supervisor circuit may include a digital circuit and pair of digital-to-analog converter (DAC) circuits which are coupled to drive the first and second battery cells to balance voltages at the first and second battery cells. In addition or in the alternative, the dual-cell supervisor circuit may include a pair of digital-to-analog converter (DAC) circuits which are coupled to drive the first and second battery cells with opposite-phase currents during impedance measurement so that a sum of currents from the pair of DAC circuit can be kept constant at all times to maintain constant temperature at the dual-cell supervisor circuit. In addition or in the alternative, the battery pack, system, architecture, and methodology may include an external switched inductor which is coupled to be switched across the first battery cell or the second battery cell to perform low-loss impedance measurement of the first and second battery cells.

In another form, there is provided a high-voltage battery cell measurement system, architecture, and methodology. In the disclosed embodiments, the measurement system includes a dual-cell supervisor integrated circuit having current injection and impedance-detection circuitry connected over a plurality of terminals to separately make voltage, temperature, and impedance measurements at each of first and second battery cells that are connected in series between a first terminal of the first battery cell and a second terminal of the second battery cell. In selected embodiments, the first and second battery cells are adjacent battery cells in a multi-cell automotive battery pack. In addition, the current injection and impedance-detection circuitry may include a first analog circuit coupled to measure a voltage at the first battery cell and a second analog circuit coupled to measure a voltage at the second battery cell. In addition or in the alternative, the current injection and impedance-detection circuitry may include a digital circuit and pair of digital-to-analog converter (DAC) circuits which are coupled to drive the first and second battery cells to balance voltages at the first and second battery cells. In addition or in the alternative, the current injection and impedance-detection circuitry may include a pair of digital-to-analog converter (DAC) circuits which are coupled to drive the first and second battery cells with opposite-phase currents during impedance measurement so that a sum of currents from the pair of DAC circuit can be kept constant at all times to maintain constant temperature at the dual-cell supervisor circuit. In selected embodiments, an external switched inductor may be coupled to be switched across the first battery cell or the second battery cell to perform low-loss impedance measurement of the first and second battery cells and/or to balance voltages at the first and second battery cells.

In yet another form, there is provided a method, system, architecture, and apparatus for monitoring first and second adjacent battery cells in a multi-cell battery pack. In the disclosed methodology, a dual-cell supervisor integrated circuit is affixed to the first and second adjacent battery cells with a plurality of terminals connected to a first terminal of the first battery cell, a second terminal of the second battery cell, and a third terminal shared in common by the first and second adjacent battery cells. With the dual-cell supervisor integrated circuit affixed, first and second opposite-phase currents are separately injected into the first and second adjacent battery cells. In selected embodiments, a pair of digital-to-analog converter circuits in the dual-cell supervisor integrated circuit is used to separately inject the first and second opposite-phase currents into the first and second adjacent battery cells. In other embodiments, an external switched inductor is coupled to be alternately switched across the first battery cell and the second battery cell to perform low-loss impedance measurement of the first and second adjacent battery cells. In addition, first and second outputs from the first and second adjacent battery cells are measured at the dual-cell supervisor integrated circuit, where the first and second outputs respectively indicate first and second cell voltages of the first and second adjacent battery cells in response to the responsive to the first and second opposite-phase currents. In addition, third and fourth outputs from the first and second adjacent battery cells may be measured at the dual-cell supervisor integrated circuit, where the third and fourth outputs respectively indicate first and second cell impedances of the first and second adjacent battery cells in response to the responsive to the first and second opposite-phase currents. In addition, the disclosed method may include actively balancing voltages at the first and second adjacent battery cells with the dual-cell supervisor integrated circuit.

Because selected embodiments implementing the present invention are, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of DCS circuit 510 are circuitry located on a single integrated circuit or within a same device. Alternatively, UCS circuit 510 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Although the described exemplary embodiments disclosed herein are directed to methods and systems for using dual-cell supervisor integrated circuits to simultaneously monitor adjacent pairs of battery cells for differential cell voltages and battery temperature measurements in a high-voltage automotive battery management system, architecture, and methodology, the present invention is not necessarily limited to the example embodiments illustrate herein, and various embodiments of the circuitry and methods disclosed herein may be implemented with other devices and circuit components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure.

For example, selected aspects are shown in block diagram form, rather than in detail, in order to avoid limiting or obscuring the present descriptions. In addition, some portions of the detailed descriptions provided herein are presented in terms of algorithms or operations on data within a computer memory. Such descriptions and representations are used by those skilled in the art to describe and convey the substance of their work to others skilled in the art.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A battery pack comprising:
    at least a first battery cell and a second battery cell; and
    a dual-cell supervisor circuit positioned to bridge the first and second battery cells and connected to monitor the first and second battery cells, wherein the dual-cell supervisor circuit comprises current injection and impedance-detection circuitry for separately measuring a voltage, impedance, and temperature at each of the first and second battery cells, the current injection and impedance-detection circuitry comprising:
    a first low drop out (LDO) regulator circuit including a first terminal connected to a first terminal of the first battery cell;
    a first analog circuit coupled in series with the first LDO regulator circuit and including a first terminal coupled to a first terminal of the second battery cell;
    a second LDO regulator circuit including a first terminal connected to the first terminal of the second battery cell;
    a second analog circuit coupled in series with the second LDO regulator circuit and including a first terminal coupled to the first terminal of the first battery cell.

2. The battery pack of claim 1, where the first and second battery cells are adjacent battery cells in a multi-cell automotive battery pack.

3. The battery pack of claim 1, where the dual-cell supervisor circuit comprises a dual-cell supervisor integrated circuit that does not require external components to measure the impedance of the first and second battery cells.

4. The battery pack of claim 1, where the dual-cell supervisor circuit comprises a dual-cell supervisor integrated circuit that is mounted on a first power bar that couples a first electrode of the first battery cell to a second electrode of the second battery cell.

5. The battery pack of claim 1, wherein
    the first analog circuit includes a second terminal coupled to a second terminal of the first battery cell; and
    the second analog circuit includes a second terminal coupled to a second terminal of the second battery cell, and the second terminal of the first battery cell is connected to the second terminal of the second battery cell.

6. The battery pack of claim 1, where the dual-cell supervisor circuit comprises a digital circuit coupled in parallel with the first and second battery cells and in parallel with a pair of digital-to-analog converter (DAC) circuits.

7. The battery pack of claim 1, where the dual-cell supervisor circuit comprises a pair of digital-to-analog converter (DAC) circuits coupled in parallel with the first and second battery cells.

8. The battery pack of claim 1, further comprising an external switched inductor which is coupled to be switched across the first battery cell or the second battery cell to perform low-loss impedance measurement of the first and second battery cells.

9. A high-voltage battery cell measurement system comprising:
    a dual-cell supervisor integrated circuit comprising current injection and impedance-detection circuitry connected over a plurality of terminals to separately make voltage, temperature, and impedance measurements at each of first and second battery cells that are connected in series between a first terminal of the first battery cell and a second terminal of the second battery cell, wherein the current injection and impedance-detection circuitry includes
    the first and second battery cells coupled in parallel with a first analog circuit coupled in series with a first low drop-out (LDO) regulator, and
    the first and second battery cells coupled in parallel with a second analog circuit coupled in series with a second LDO regulator.

10. The high-voltage battery cell measurement system of claim 9, where the first and second battery cells are adjacent battery cells in a multi-cell automotive battery pack.

11. The high-voltage battery cell measurement system of claim 9, where the current injection and impedance-detection circuitry comprises a digital circuit and pair of digital-to-analog converter (DAC) circuits which are coupled to drive the first and second battery cells to balance voltages at the first and second battery cells.

12. The high-voltage battery cell measurement system of claim 9, where the current injection and impedance-detection circuitry comprises a pair of digital-to-analog converter (DAC) circuits which are coupled to drive the first and second battery cells with opposite-phase currents during impedance measurement so that a sum of currents from the pair of DAC circuit can be kept constant at all times to maintain constant temperature at the dual-cell supervisor circuit.

13. The high-voltage battery cell measurement system of claim 9, further comprising an external switched inductor which is coupled to be switched across the first battery cell or the second battery cell to perform low-loss impedance measurement of the first and second battery cells.

14. The high-voltage battery cell measurement system of claim 9, further comprising an external switched inductor which is coupled to be switched across the first battery cell or the second battery cell to balance voltages at the first and second battery cells.

15. A method for monitoring first and second adjacent battery cells in a multi-cell battery pack comprising:
    affixing a dual-cell supervisor integrated circuit to the first and second adjacent battery cells with a plurality of terminals connected to a first terminal of the first battery cell, a second terminal of the second battery cell, and a third terminal shared in common by the first and second adjacent battery cells;
    separately injecting first and second opposite-phase currents into the first and second adjacent battery cells; and measuring first and second outputs from the first and second adjacent battery cells at the dual-cell supervisor integrated circuit which respectively indicate first and second cell voltages of the first and second adjacent battery cells in response to the first and second opposite-phase currents.

16. The method of claim 15, further comprising measuring third and fourth outputs from the first and second adjacent battery cells at the dual-cell supervisor integrated circuit which respectively indicate first and second cell impedances of the first and second adjacent battery cells in response to the responsive to the first and second opposite-phase currents.

17. The method of claim 15, where a pair of digital-to-analog converter circuits in the dual-cell supervisor integrated circuit separately inject the first and second opposite-phase currents into the first and second adjacent battery cells.

18. The method of claim 15, where an external switched inductor which is coupled to be alternately switched across the first battery cell and the second battery cell to perform low-loss impedance measurement of the first and second adjacent battery cells.

19. The method of claim 15, further comprising actively balancing voltages at the first and second adjacent battery cells with the dual-cell supervisor integrated circuit.

\* \* \* \* \*